US006804283B2

(12) United States Patent
Scherer

(10) Patent No.: US 6,804,283 B2
(45) Date of Patent: Oct. 12, 2004

(54) COMPACT ELECTRICALLY AND OPTICALLY PUMPED MULTI-WAVELENGTH NANOCAVITY LASER, MODULATOR AND DETECTOR ARRAYS AND METHOD OF MAKING THE SAME

(75) Inventor: Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 17 days.

(21) Appl. No.: 10/044,502

(22) Filed: Jan. 10, 2002

(65) Prior Publication Data

US 2002/0167984 A1 Nov. 14, 2002

Related U.S. Application Data

(60) Provisional application No. 60/261,341, filed on Jan. 11, 2001.

(51) Int. Cl.[7] .................................................. H01S 5/00
(52) U.S. Cl. ..................................... 372/50; 372/29.022
(58) Field of Search ....................... 372/50, 98, 29.022, 372/92; 237/98, 15; 385/14

(56) References Cited

U.S. PATENT DOCUMENTS

| | | | | |
|---|---|---|---|---|
| 4,503,447 | A | * 3/1985 | Iafrate et al. | .................. 257/15 |
| 5,448,582 | A | 9/1995 | Lawandy | |
| 5,526,449 | A | * 6/1996 | Meade et al. | .................. 385/14 |
| 5,568,574 | A | * 10/1996 | Tanguay et al. | .............. 385/14 |
| 5,706,383 | A | * 1/1998 | Malcuit et al. | ............. 385/131 |
| 5,955,749 | A | * 9/1999 | Joannopoulos et al. | ....... 257/98 |
| 6,009,115 | A | 12/1999 | Ho | |
| 6,058,127 | A | * 5/2000 | Joannopoulos et al. | ....... 372/92 |
| 6,175,671 | B1 | * 1/2001 | Roberts | ........................ 385/14 |
| 6,317,554 | B1 | * 11/2001 | Kosaka et al. | .............. 385/132 |
| 6,344,272 | B1 | 2/2002 | Oldenburg et al. | |
| 6,512,866 | B1 | * 1/2003 | Fan et al. | ...................... 385/27 |
| 6,597,721 | B1 | * 7/2003 | Hutchinson et al. | .......... 372/98 |

OTHER PUBLICATIONS

O. Painter et al., Two–Dimensional Photonic band–Gap Defect Mode Laser ; Jun. 1999; Science vol. 284 ; p 1819.*
W. d. Zhou et al.;Electrically Injected Single–Defect photonic bandbap Surface–Emitting Laser at room Temperature; Aug. 2000; electronics Letter ; vol. 36; No. 18.*
S. Y. Lin et al.; Dirrect Mesurement of the Quality Factor In Two–demensional Photonic–Crystal Mirocavity; Dec. 2001; Optical Society of America vol. 26, No. 23; p. 1903.*

* cited by examiner

Primary Examiner—Don Wong
Assistant Examiner—Hung Tran Vy
(74) Attorney, Agent, or Firm—Daniel L. Dawes; Myers Dawes Andras & Sherman LLP

(57) ABSTRACT

A compact, electrically and optically pumped multi-wavelength nanocavity laser, modulator and detector array uses lithography to define the precise spectral response of each element. High fields are applied within optical nanocavities to take advantage of photonic crystals filled with nonlinear materials. These nonlinearities and high fields are used to define tunable nanocavity lasers, detectors, routers, gates and spectrometers for wavelength and time division multiplexing applications. Similarly, nanofabricated optical waveguides can be used for efficient coupling of light between devices. The lithographic control over the wavelength and polarization supported within photonic crystal cavities is used to construct compact nanophotonic laser and detector arrays, and all-optical gates and routers. The photonic crystal couples light emitted by one cavity, and uses it to optically pump another with negligible diffraction losses. The emission wavelength of light from these photonic crystal lasers can be varied by simple adjustments of the lithographic pattern during their fabrication.

20 Claims, 9 Drawing Sheets

In-Plane Emission (FDTD Simulation)

Vertical Emission (cut through slab)

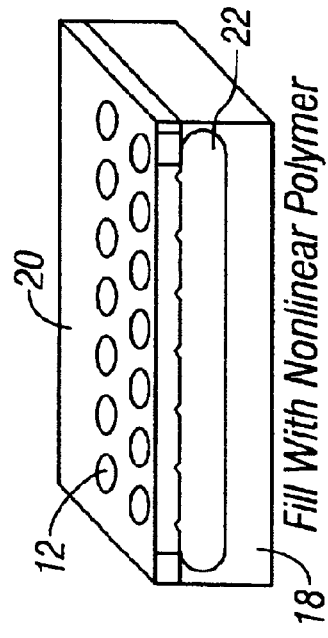
FIG. 7A Planar PBG Membrane
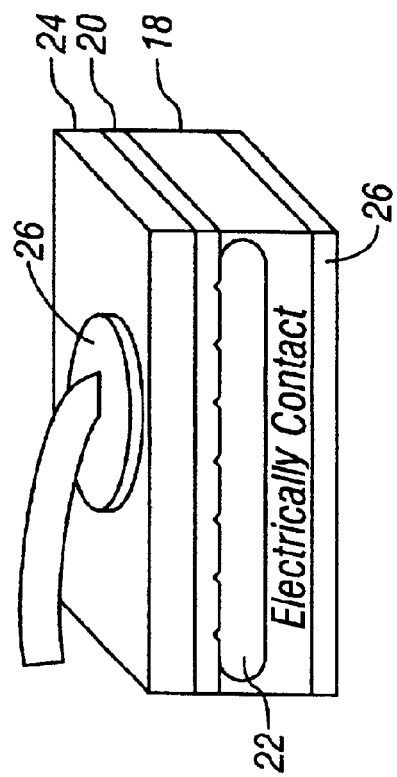
FIG. 7B Fill With Nonlinear Polymer
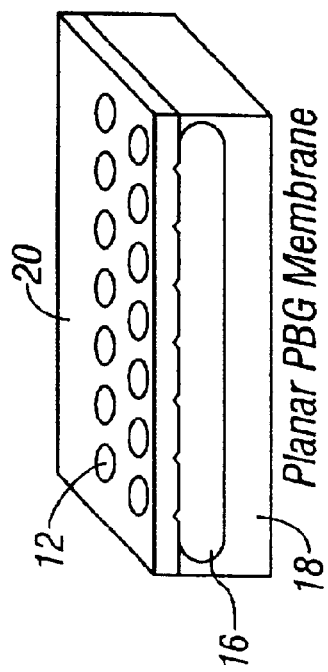
FIG. 7C Spin On More Nonlinear Material
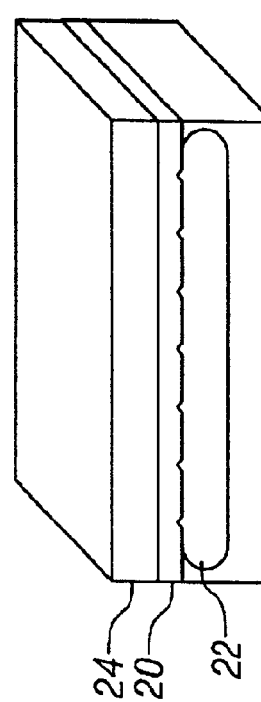
FIG. 7D Electrically Contact

COMPACT ELECTRICALLY AND OPTICALLY PUMPED MULTI-WAVELENGTH NANOCAVITY LASER, MODULATOR AND DETECTOR ARRAYS AND METHOD OF MAKING THE SAME

RELATED APPLICATIONS

The present application is related to and claims priority under 35 USC 119 to U.S. Provisional Patent Application entitled, "Nonlinear Photonic Crystal Devices", Ser. No. 60/261,341, filed Jan. 11, 2001, which is incorporated herein by reference.

BACKGROUND OF THE INVENTION

1. Field of the Invention

The invention relates to the field of nanocavity optical arrays and in particular to an compact electrically and optically pumped multiwavelength nanocavity array in which each nanocavity is lithographically formed to define a corresponding predetermined spectral response of each nanocavity.

2. Description of the Prior Art

The past rapid emergence of optical micro cavity devices, such as vertical cavity surface emitting lasers (VCSELs) can be largely attributed to the high precision over the layer thickness control available during semiconductor crystal growth. High reflectivity mirrors can thus be grown with sub-nanometer accuracy to define high-Q cavities in the vertical dimension. Recently, it has also become possible to microfabricate high reflectivity mirrors by creating two- and three-dimensional periodic structures. These periodic "photonic crystals" can be designed to open up frequency bands within which the propagation of electromagnetic waves is forbidden irrespective of the propagation direction in space and to define photonic bandgaps. When combined with high index contrast slabs in which light can be efficiently guided, microfabricated two dimensional photonic bandgap mirrors provide us with the geometries needed to confine and concentrate light into extremely small volumes and to obtain very high field intensities. Here we propose to use these "artificially" microfabricated crystals in functional nonlinear optical devices, such as lasers, modulators, add/drop filters, polarizers and detectors.

BRIEF SUMMARY OF THE INVENTION

A compact electrically and optically pumped multi-wavelength nanocavity laser, modulator and detector arrays uses lithography to define the precise spectral response of each element. High fields are applied within optical nanocavities to take advantage of photonic crystals filled with nonlinear materials. These nonlinearities and high fields are used to define tunable nanocavity lasers, detectors, routers, gates and spectrometers for wavelength and time division multiplexing applications.

Subwavelength nano-optic cavities can be used for efficient and flexible control over both emission wavelength and frequency. Similarly, nanofabricated optical waveguides can be used for efficient coupling of light between devices. This new capability allows the reduction of the size of optical components and leads to their integration in large numbers, much in the same way as electronic components have been integrated for improved functionality to form microchips. As high-Q optical and electronic cavity sizes approach a cubic half-wavelength, the spatial and spectral densities (both electronic and optical) increase to a point where the light-matter coupling becomes so strong that spontaneous emission is replaced by the coherent exchange of energy between the two systems.

The lithographic control over the wavelength and polarization supported within photonic crystal cavities is used to construct compact nanophotonic laser and detector arrays, as well as all-optical gates and routers. This spontaneous emission coupling efficiency can be even higher if the line width of the semiconductor emission is narrowed, as will be the case when using quantum dot active material. Therefore, single defect photonic crystal lasers represent in many ways the ultimate evolution of VCSELs, since control over both vertical and lateral spontaneous emission is possible. With most of the spontaneous emission funneled into a single optical mode, the photonic crystal laser can be modulated at much higher frequencies even close to threshold. The photonic crystal couples light emitted by one cavity, and uses it to optically pump another with negligible diffraction losses. Photonic crystals are also the perfect medium for constructing what have been termed "photonic molecules", or interconnected cavities which can share and exchange photons. The emission wavelength of light from these photonic crystal lasers can be varied by simple adjustments of the lithographic pattern during their fabrication. Another unique feature of active photonic crystal cavities, which arises from their ability to limit the number of modes supported within the laser, is the ability to build high contrast modulators.

The invention is thus defined as a compact electrically and optically pumped multiwavelength nanocavity array comprising a plurality of nanocavities. Each nanocavity is defined in a photonic crystal where each nanocavity is lithographically formed to define a corresponding predetermined spectral response of each nanocavity. The plurality of nanocavities forming the array. The spectral response which is lithographically formed defines wavelength supported by the nanocavity. The spectral response which is lithographically formed may also define polarization supported by the nanocavity.

The array may be a laser array, detector array, all optical gate, all optical router, or a modulator. The photonic crystal is formed in one embodiment in active quantum well material.

In the illustrated embodiment the nanocavities are vertical cavity surface emitting lasers, VCSELs. The size of each of the nanocavities is approximately a cubic half-wavelength. In one embodiment at least one nanocavity laser is used as a pump for an adjacent nanocavity laser.

The array further comprises a nonlinear optical material filling the photonic crystal. The array may then be realized as a tunable nanocavity laser, detector, router, gate or spectrometer array. The array further comprises means for changing optical or electrical properties of the nonlinear optical material in each of the nanocavities, such as electrodes for applying a voltage or current across the array.

In one embodiment the photonic crystals in the array are defined in Si—Ge materials on silicon substrates disposed on insulators. The array may further comprise a silicon slab waveguide or integrated circuit integrated with the array.

In another embodiment the array further comprises a waveguiding layer disposed adjacent to the array. The waveguiding layer is substantially transparent to light from the array and is critically coupled to the nanocavities in the array.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 1a is a two dimensional graphic depiction of in-plane emission as provided by FDTD simulation.

FIG. 1b shows the vertical emission as seen in a cross-sectional cut through slab.

FIGS. 7a–7d are perspective cross-sectional views which diagrammatically depict the filling of a planar PBG membrane with nonlinear optical polymer.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1A:
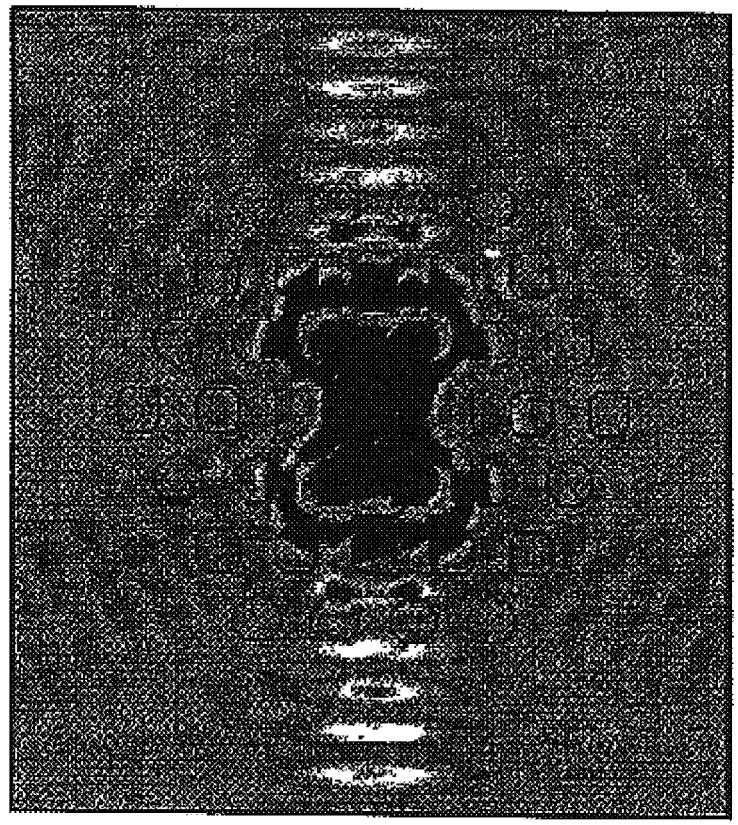
FIGS. 1a and 1b are two dimensional graphic depictions of the field Intensity of light leakage from a single defect surrounded by three periods of photonic crystal and slightly enlarged holes in the horizontal direction. Light preferentially emits in the y dipole.
Figure 1B:
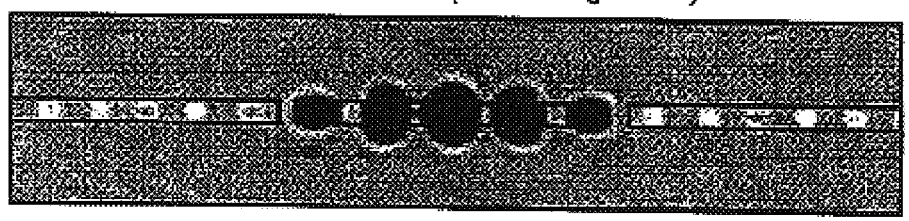
Figure 2A:
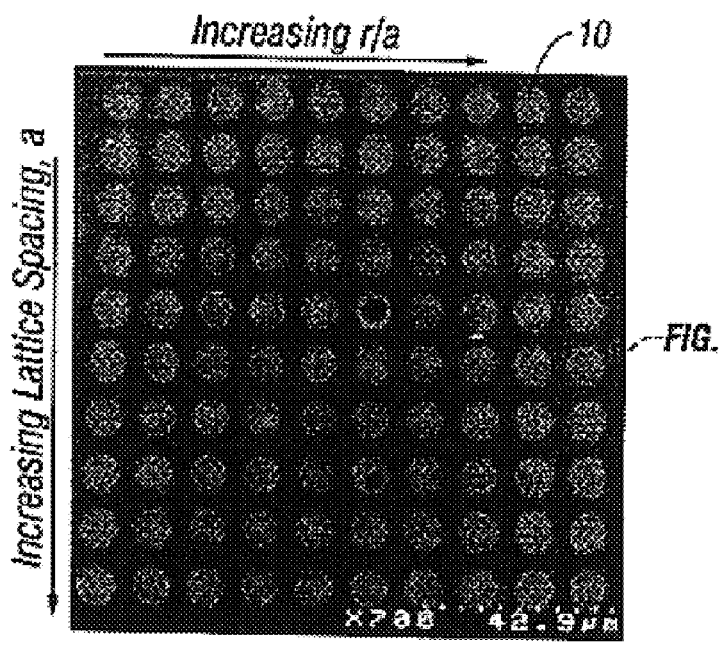
FIGS. 2a and 2b are photographic depictions of a 10×10 multi-wavelength laser array within a 100×100 micron area. Each laser emits at a lithographically controlled wavelength. Each element in the array of FIG. 2a is comprised of a photonic crystal array as shown in the enlargement of FIG. 2b.
Figure 2B:
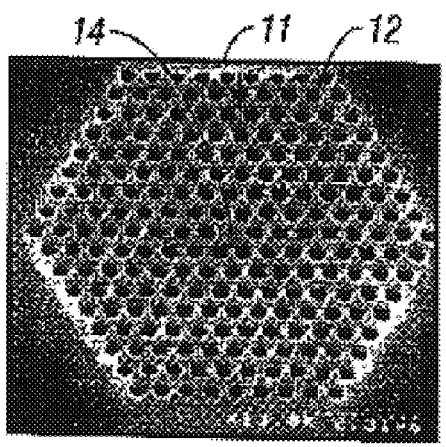

Fabrication of optical structures has evolved to a precision which allows us to control light within etched nanostructures. FIG. 2a shows a multiwavelength laser array of elements 10. Each element 10 is comprised of a photonic array 11 shown in the enlargement of FIG. 2b in which an array 11 of holes 12 are formed with a single center defect 14 or absence of a hole 12. For example, subwavelength nano-optic cavities can be used for efficient and flexible control over both emission wavelength and frequency. Similarly, nanofabricated optical waveguides can be used for efficient coupling of light between devices. This new capability allows the reduction of the size of optical components and leads to their integration in large numbers, much in the same way as electronic components have been integrated for improved functionality to form microchips. As high-Q optical and electronic cavity sizes approach a cubic half-wavelength, the spatial and spectral densities (both electronic and optical) increase to a point where the light-matter coupling becomes so strong that spontaneous emission is replaced by the coherent exchange of energy between the two systems.

Figure 3:
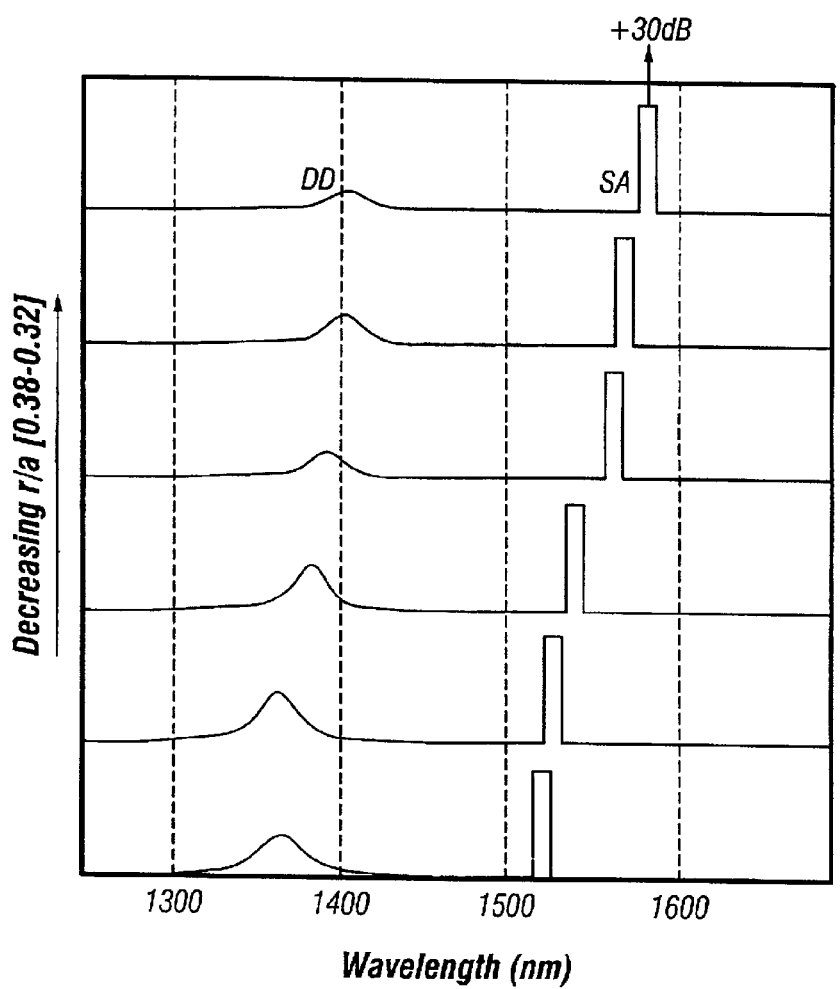
FIG. 3 is sample spectra taken from lasers defined within the 10×10 array of FIG. 2a. The vertical scale is in decreasing r/a where a is the lattice spacing and r the hole diameter. The horizontal scale is in increasing wavelength in nm.
Figure 4A:
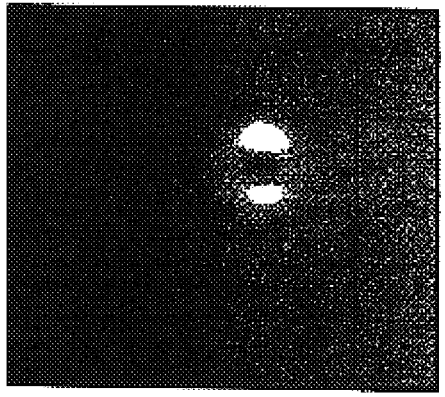
FIGS. 4a–4d depict diameters of a pump laser used to excite a single defect nanocavity.
Figure 4B:
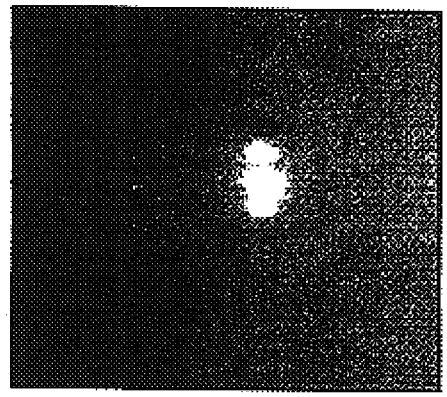
Figure 4C:
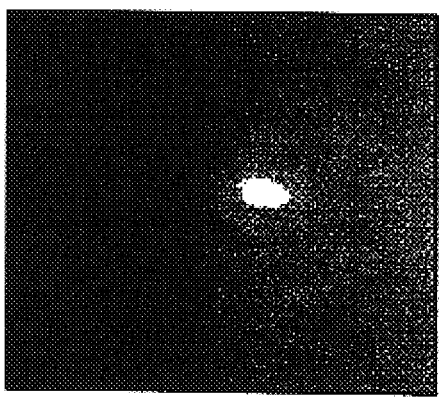
Figure 4D:
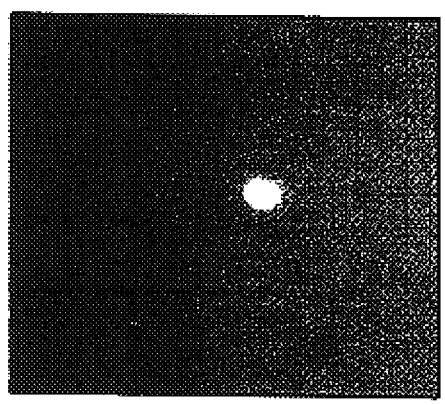
Figure 5A:
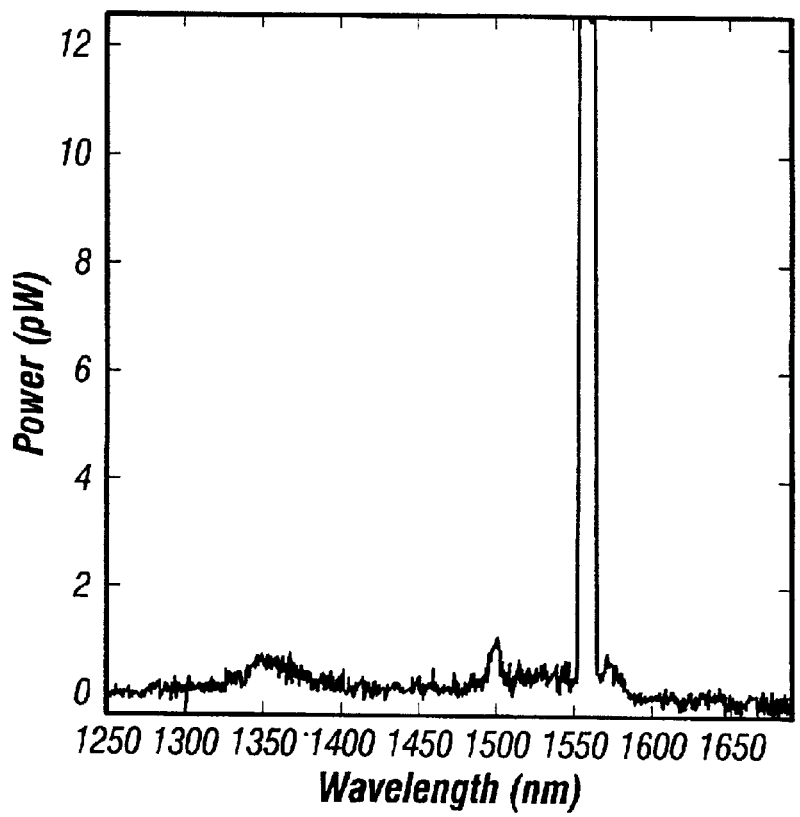
FIGS. 5a–5d are the corresponding spectra produced by the pumped laser inputs of FIGS. 4a–4d respectively.
Figure 5B:
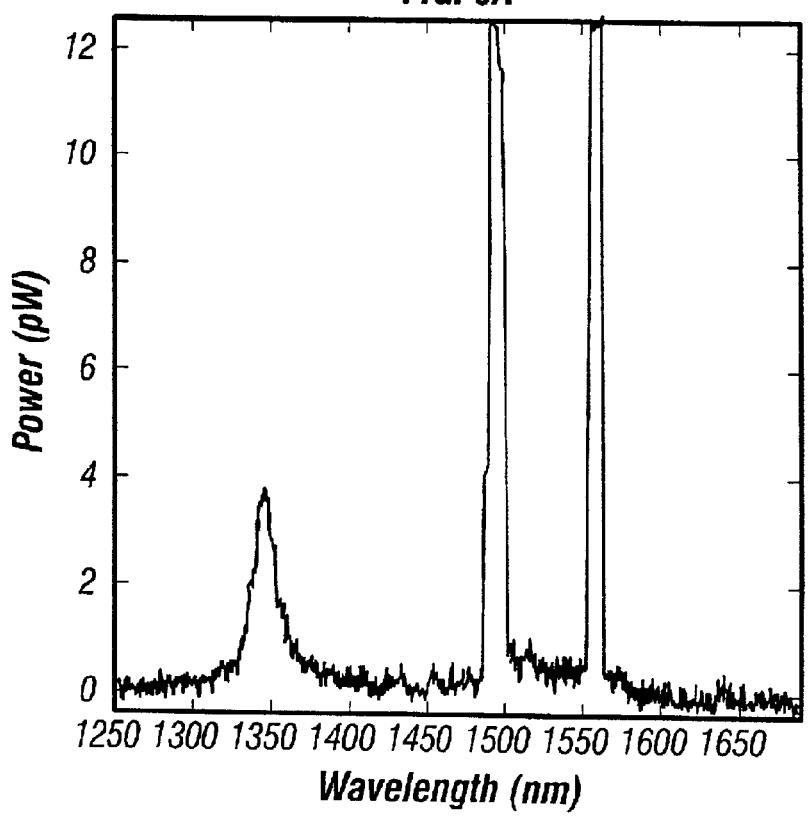
Figure 5C:
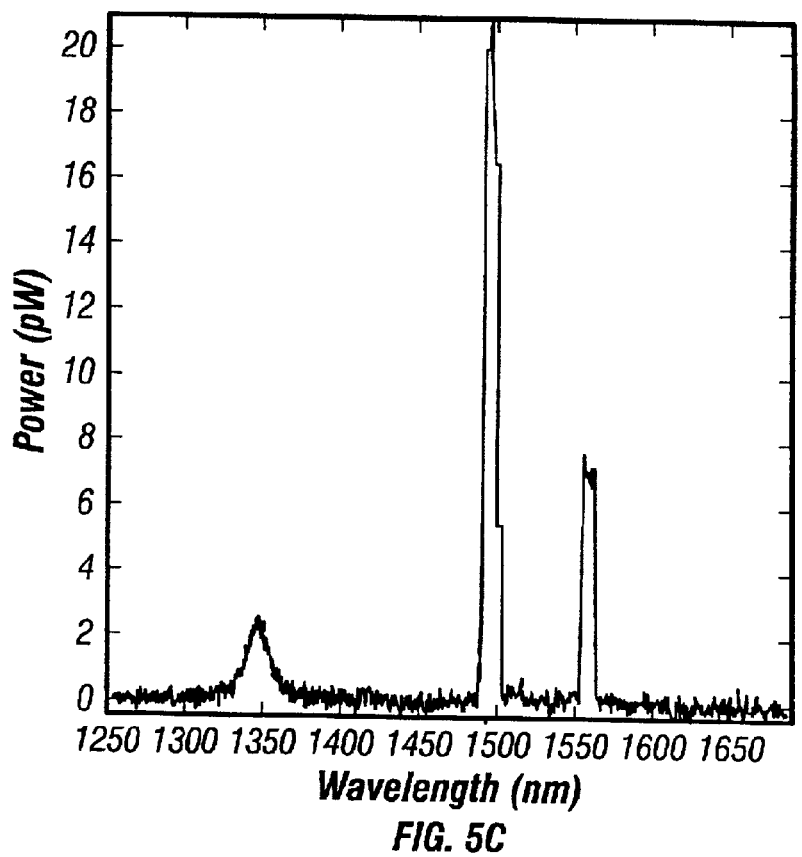
Figure 5D:
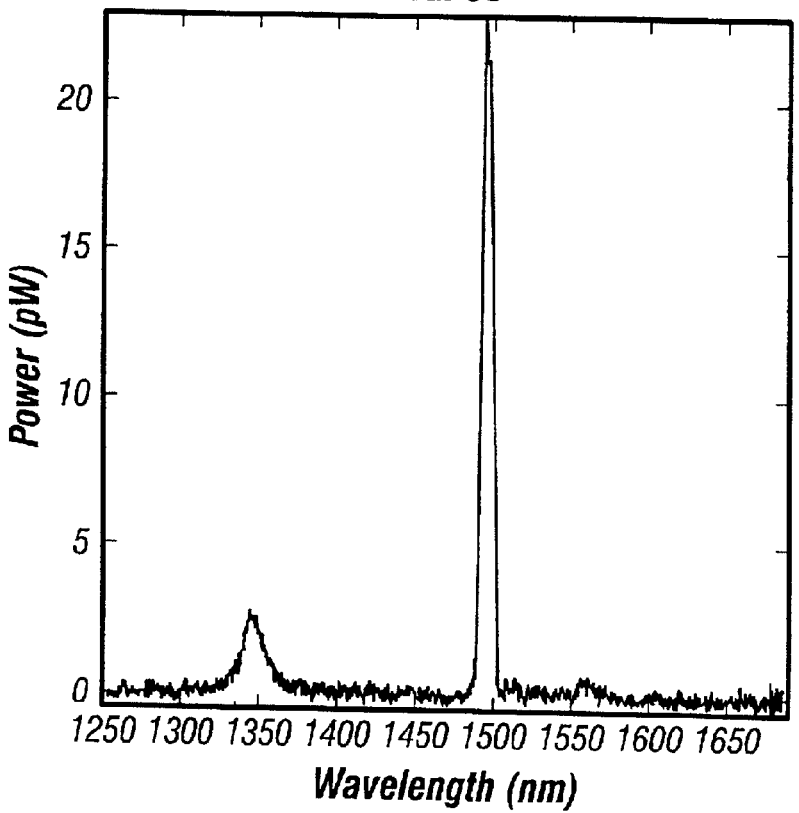
Figure 6A:
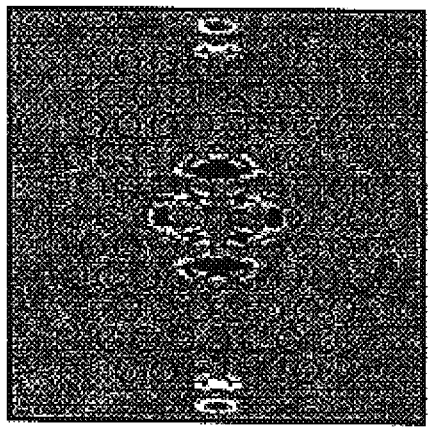
FIGS. 6a–6d are the corresponding two dimensional FDTD simulations of the excited spectra of FIGS. 5a–5d respectively.
Figure 6B:
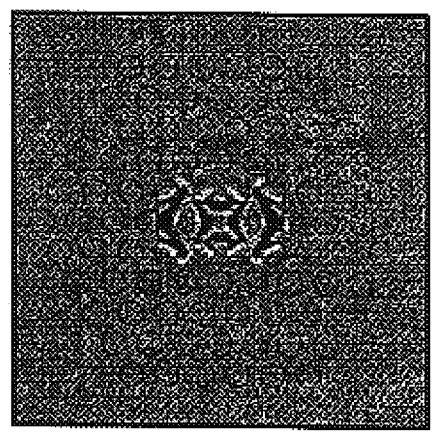
Figure 6C:
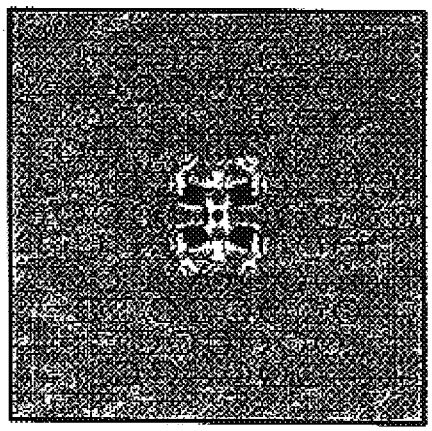
Figure 6D:
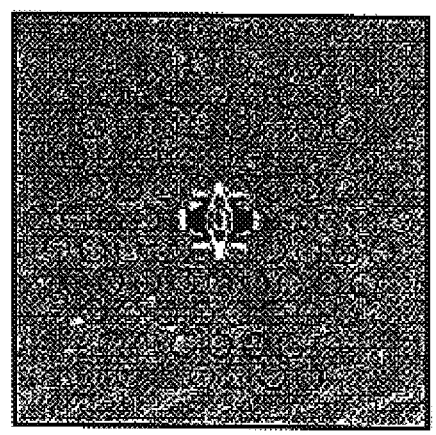

According to the invention the lithographic control over the wavelength and polarization supported within photonic crystal cavities is used to construct compact nanophotonic laser and detector arrays, as well as all-optical gates and routers. We have already demonstrated room temperature lasing in the smallest optical cavities, with mode volumes down to 2.5 $(\lambda/2n_{slab})^3$, or 0.03 $\mu m^3$ in InGaAsP emitting at 1.55 $\mu m$. We have also been able to tune the emission wavelength of these lasers from 1450 nm to 1620 nm within a 10×10 laser array in an area of 100 $\mu m$×100 $\mu m$ by local lithographic modification of the cavity lengths. As the mode volumes of nano-cavities are decreased, the coupling efficiency between the spontaneous emission within the cavity and the lasing mode can be significantly improved. We have calculated spontaneous emission coupling factors (β) above 85% for optimized photonic crystal lasers constructed in active quantum well material. This spontaneous emission coupling efficiency can be even higher if the line width of the semiconductor emission is narrowed, as will be the case when using quantum dot active material. Therefore, single defect photonic crystal lasers represent in many ways the ultimate evolution of VCSELs, since control over both vertical and lateral spontaneous emission is possible. With most of the spontaneous emission funneled into a single optical mode, the photonic crystal laser can be modulated at much higher frequencies even close to threshold. The photonic crystal provides us with the unique opportunity of coupling light emitted by one cavity, and using it to optically pump another with negligible diffraction losses. Photonic crystals are also the perfect medium for constructing what have been termed .'photonic molecules", or interconnected cavities which can share and exchange photons. Finally, we have shown that the emission wavelength of light from these photonic crystal lasers can be varied by simple adjustments of the lithographic pattern during their fabrication. Thus, single mode lasers emitting at 1450 nm can be fabricated only microns apart from lasers emitting at 1600 nm and could share the same waveguide slab. Photonic crystals provide us with the opportunity of constructing very compact laser sources with designed frequencies as shown in FIG. 3 and polarization as well as wavelength and polarization sensitive detector arrays. Moreover, they can form very flexible platforms for connecting optical sources, detectors, routers, modulators, polarizers and filters in very compact microfabricated systems.

Another unique feature of active photonic crystal cavities, which arises from their ability to limit the number of modes supported within the laser, is the ability to build high contrast modulators. FIGS. 4a–6d show examples of such a single defect photonic crystal cavity, which supports both shallow acceptor modes as well as deep donor modes within the same cavity. Depending on the diameter of the pump beam, shown in FIGS. 4a–4d, we find that different modes are excited, and these in turn exhibit different spectra in corresponding FIGS. 5a–5d respectively. Finite-difference time-domain simulations of the expected geometric distribution of the field intensities within these modes are also shown in corresponding FIGS. 6a–6d respectively, and the relative overlap of the pump beam with the expected mode geometries matches well to the observations.

In summary, we propose the construction of compact electrically and optically pumped multi-wavelength nanocavity laser, modulator and detector arrays in which lithography is used to define the precise spectral response of each element. We also expect to use the high fields within optical nanocavities and take advantage of these when filling the voids of the photonic crystals with nonlinear materials. We will use these nonlinearities and high fields to define tunable nanocavity lasers, detectors, routers, gates and spectrometers for wavelength and time division multiplexing applications.

Integration of Photonic Crystals with Nonlinear Polymers

By combining two emerging technologies, i.e., photonic bandgap crystals with nonlinear organic polymers, it will become possible to spectrally tune and modulate ultra-small optical cavities with low threshold powers. The very porous structure of photonic crystals is very well suited for the incorporation of nonlinear materials, as are the high optical fields and high Qs, which can be developed within photonic crystal nanocavities. One of the simplest approaches for using the nonlinearities of organic molecules within photonic crystals consists of filling the voids in the holes which define the photonic crystals.

Altering the refractive index of the polymer either optically or electrostatically then indirectly tunes the effective cavity length, an effect which can be used to modulate an incident laser beam. Even more efficient nonlinear switching is expected if the nanocavity design is optimized to include a void at the center of the cavity to place the back-filled nonlinear polymer within the field maximum of the optical standing wave. We have already designed cavities in which this is possible, and calculate Qs in excess of 15,000 for these nanocavities from finite difference time domain models.

FIGS. 7a–7d graphically illustrate the filling of a photonic crystal with nonlinear optical material. FIG. 7a is a perspective cross-sectional view of a PBG membrane in which a plurality of holes 12 are defined through a membrane 20 suspended above a cavity 16 defined between membrane 20 and substrate 18. Cavity 16 is filled with the nonlinear polymer 22 through holes 12 as shown in FIG. 7b. A thin layer 24 of nonlinear material is then spun on top of the filled holes 16 as shown in FIG. 7c and then an electrical contact 26 is formed on layer 24 as shown in FIG. 7d.

Another opportunity for the inclusion of nonlinear molecules within photonic crystals relies on tuning the dispersive performance of photonic bandgaps. It is well known that the relatively flat band structure exhibited by photonic crystals in certain directions leads to a large density of states, results in lensing and superprism effects. Thus, tunable photonic crystals can become useful for miniaturization of wavelength-dispersive devices such as spectrometers. WDM receivers can thus be constructed in very compact and robust monolithic geometries, and can be electrically or optically fine-tuned by injecting optically nonlinear materials into the voids of the photonic crystal. Both of the examples described above rely on the relatively robust nature of the photonic bandgap as well as the porosity of typical photonic crystals, and describe the operation of discrete tunable devices. It is clear, however, that the most important advantage of using photonic crystals lies in providing a robust platform for efficiently guiding light between many nanophotonic devices which can be integrated into dense arrays. For example, dense multi-wavelength sources can be developed, in which the precise wavelengths of each device can be coarsely tuned lithographically, whereas the precise wavelength operation can be retroactively adjusted by introducing electrostatic or optical changes in nonlinear materials close to each optical nanocavity. Indeed, if photonic crystal circuits are to be used as wavelength-dispersive optical routers, it is necessary to control the precise resonance wavelength to better than what fabrication tolerances presently permit if full use of the high Qs available in such cavities is to be made. Spectral alignment of individual devices within large cascadable logic arrays thus requires the introduction of "tuning knobs" which can be conveniently provided through nonlinear materials. Moreover, the use of dense photonic crystal devices is certainly not limited to optical sources, which we have described so far. Detector arrays, in which the polarization and frequency of the incoming light can be sorted are equally interesting, and may operate either for light incident in-plane or out of plane of the two dimensional photonic crystal slab.

Si—Ge/SOI Detector Arrays

Figure 8:
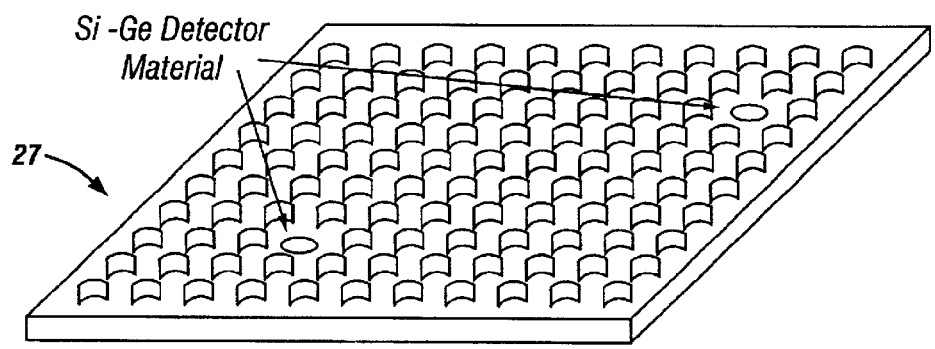
FIG. 8 is a perspective view of a photonic array in which selected holes have been filled with Si—Ge detector material.

Silicon on insulator (SOI) structures, which have been developed for microelectronic uses, have become very desirable starting materials for photonic integrated circuits. These materials, which offer the ease of fabrication available from silicon processing technology, as well as a transparent waveguiding material with a high dielectric constant, are particularly useful if optical and electronic functions are to be combined. Unfortunately, silicon does not have a direct bandgap and is expected to only find limited applications for the construction of light sources. However, when silicon germanium is grown on the silicon waveguiding membrane, it is possible to construct ultra-small and very sensitive detector arrays which make use of both photon recycling and field concentration available from the photonic crystal nanocavities by growing Si—Ge or Ge layer 27 on the silicon waveguiding layer as diagrammatically depicted in the perspective view of FIG. 8.

Such detector structures can serve as demultiplexers for optical telecommunications systems. In these photonic crystal structures, both spectral and polarization response can be controlled through the design of the geometry and field distribution. Simple processing, available in both Si and Ge through the use of previously optimized freon etches, readily allows integration of Si—Ge nanophotonic detector arrays with silicon slab waveguides and silicon electronic amplification circuitry. The detectors can be spectrally filtered and their response can be accurately tuned through the introduction of nonlinear optical polymers. These devices can also be electrically contacted and further integrated with fast and sensitive electronic amplification circuitry, thereby leveraging experience from modern microelectronic fabrication technology.

Critical Coupling to Waveguiding Layers

In an active photonic integrated circuit composed of a photonic crystal backplane, light reabsorption often represents a very important problem. Thus, even though lasers can be fabricated in large numbers and connected with next-nearest neighbor interaction, wave guiding of light across large distances within the plane of the photonic crystal results in prohibitive re-absorption losses. This re-absorption can be reduced when using quantum dot material, albeit at the expense of reducing the gain within the optical cavities.

Figure 9:
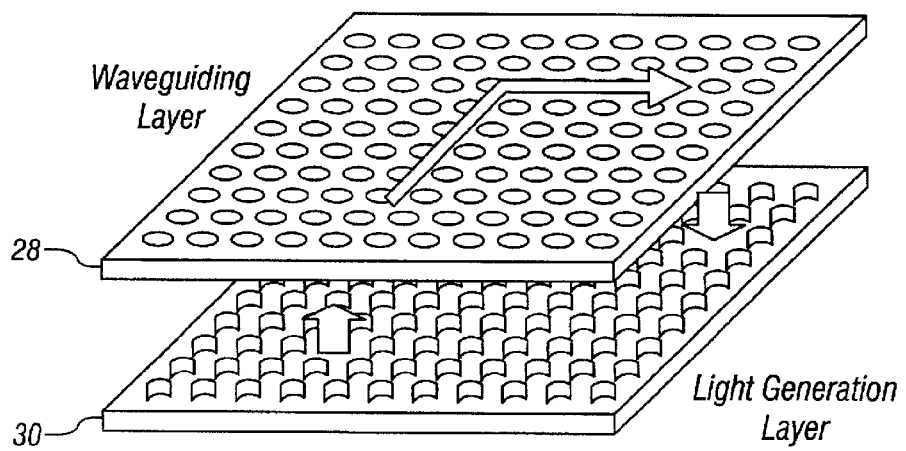
FIG. 9 is an exploded perspective view of a waveguiding layer and a light generation layer which have been optically coupled by means of critical coupling.

Another very flexible method of avoiding the problem of in-plane re-absorption lies in the introduction of a waveguiding layer 28, parallel to the light generation layer 30 as shown in the exploded perspective view of FIG. 9, which layer 28 is completely transparent to the light emitted by the active devices in layer 30. For example, emitting devices in layer 30 can be designed to couple into a high refractive index Si membrane either above or below the active emitting layer 30. Technologically, this can be done by planarizing the photonic crystal active devices after their construction, followed by sputter-deposition of a polysilicon slab waveguide above this light emitting layer 30. In designing the waveguiding layer 28, it is important to couple efficiently into the waveguide without reducing the Q of the original nanocavity. The concept of "critical coupling", adopted from microwave design, offers the very exciting possibility of accomplishing this goal. Critical coupling between an optical waveguides and a cavity is achieved when the losses from an optical cavity are exactly matched by the coupling strength between the cavity and the waveguide. This principle has recently been demonstrated between high-Q spherical resonators and tapered glass fibers. Highly efficient addition and subtraction of a wavelength channel into and out of a waveguide arises from the interference between the traveling wave in the resonator and the traveling wave in the waveguide. Therefore, by using critical coupling of light between the source and waveguide layers, it is possible to retain the high Qs inherent to photonic crystal nanocavities for narrow spectral width add/drop filters and modulators and still have very efficient light coupling between the resonator and the waveguide.

Many alterations and modifications may be made by those having ordinary skill in the art without departing from the spirit and scope of the invention.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. An improvement in a compact electromagnetically pumped multiwavelength photonic device which includes an array of holes in a photonic crystal and a plurality of defects in the array of holes, each defect in the array defining a cavity, the improvement comprising a periodic patterned array of the plurality of cavities, each cavity having a corresponding predetermined spectral response, so that said plurality of cavities forming the periodic patterned array of cavities collectively define a supercavity in the photonic device.

2. The improvement of claim 1 where said spectral response of each cavity is defined by the wavelength of the electromagnetic wave which is supported in the photonic crystal by said lithographically defined nanocavity.

3. The improvement of claim 1 where said spectral response of each cavity is defined by the polarization of the electromagnetic wave which is supported by said lithographically defined cavity.

4. The improvement of claim 1 where said spectral response of each cavity is defined by the polarization and wavelength of the electromagnetic wave which is supported by said lithographically defined cavity.

5. The improvement of claim 1 where the photonic device comprises a laser and wherein said array of cavities is employed in the laser.

6. The improvement of claim 1 where the photonic device comprises a detector and wherein said array of cavities is employed in the detector.

7. The improvement of claim 1 where the photonic device comprises an optical gate and wherein said array of cavities is employed in the all optical gate.

8. The improvement of claim 1 where the photonic device comprises an all optical router and wherein said array of cavities is employed in the all optical router.

9. The improvement of claim 1 where the photonic device comprises a modulator and wherein said array of cavities is employed in the modulator.

10. The improvement of claim 1 wherein an active quantum well is included in the photonic device and wherein said photonic crystal in which the array of cavities are defined is formed in the active quantum well.

11. The improvement of claim 1 where the photonic device comprises a vertical cavity surface emitting laser and wherein said array of cavities is employed in the vertical cavity surface emitting laser, VCSEL.

12. The improvement photonic device of claim 11 wherein said cavities each have a volume and wherein said volume of each of said cavities is approximately a cubic half-wavelength ($\lambda^3/2$).

13. The improvement of claim 1 comprises an array of lasers each including an array of cavities and where at least one laser is used as a pump for an adjacent laser.

14. The improvement of claim 1 further comprising a nonlinear optical material filling said holes in the photonic crystal in which the array of cavities are defined.

15. The improvement of claim 14 wherein said photonic device with the array of cavities defined in the filled photonic crystal comprises a tunable laser, detector, router, gate or spectrometer array.

16. The improvement of claim 14 further comprising means for changing optical or electrical properties of said nonlinear optical material in each of said cavities.

17. The improvement of claim 1 where said photonic crystal in which said array is defined comprises a Si—Ge material on a silicon substrate disposed on an insulator.

18. The improvement photonic device of claim 17 further comprising a silicon slab waveguide or integrated circuit integrated with said array of cavities.

19. The improvement photonic device of claim 17 further comprising a nonlinear optical material filling said photonic crystal and means for changing optical or electrical properties of said nonlinear optical material surrounding each of said cavities.

20. The improvement of claim 1 further comprising a waveguiding layer disposed adjacent to said array of cavities, said waveguiding layer being transparent to light from said array and critically coupled to said cavities in said array.

* * * * *